United States Patent [19]
Schmidt

[11] 3,811,100
[45] May 14, 1974

[54] CHANNEL SELECTOR AND INDICATOR FOR MULTI-CHANNEL RECEIVER

[75] Inventor: Hans Schmidt, Forest Park, Ill.

[73] Assignee: Motorola, Inc., Franklin Park, Ill.

[22] Filed: Apr. 20, 1972

[21] Appl. No.: 246,035

[52] U.S. Cl. .......................... 334/15, 334/6, 334/16, 334/86

[51] Int. Cl. .......................... H03j 3/06

[58] Field of Search .......... 334/15, 16, 1, 2, 6, 86, 334/87

[56] References Cited

UNITED STATES PATENTS

| | | | |
|---|---|---|---|
| 3,593,152 | 7/1971 | Aoki | 334/86 |
| 3,678,421 | 7/1972 | Ono | 334/15 |
| 3,439,292 | 4/1969 | Henry | 334/15 X |
| 3,673,523 | 6/1972 | Russel | 334/15 |
| 3,573,684 | 4/1971 | Dickinson | 334/15 |
| 3,573,683 | 4/1971 | Marshall | 334/15 |
| 3,596,183 | 7/1971 | Spies | 334/15 |

*Primary Examiner*—Archie R. Borchelt
*Assistant Examiner*—Saxfield Chatmon, Jr.
*Attorney, Agent, or Firm*—Donald B. Southard; Vincent J. Rauner

[57] ABSTRACT

A control assembly for making channel selections in a multi-channel receiver apparatus, such as a television set, and which is comprised of a plurality of voltage selector and channel indicator units. The selector/indicator units are in modular form and include an adjustable resistance or potentiometer assembly for selective interposition between a source of reference potential and a voltage responsive, frequency determining element in the associated receiver's tuner apparatus. An included indicator wheel for providing a visual indication of the channel selected also determines the setting of the movable contactor arm of the potentiometer assembly relative to the resistance element, and thus serve as a coarse tuning adjustment. A thumb wheel with a spiral groove on its inner face which is provided in rotatable engagement with a projection in the potentiometer's resistance element for adjusting the latter through a predetermined but limited range of movement, thereby effecting a fine tuning facility.

7 Claims, 4 Drawing Figures

CHANNEL SELECTOR AND INDICATOR FOR MULTI-CHANNEL RECEIVER

BACKGROUND OF THE INVENTION

The present invention relates in general to channel selectors and more particularly to a control assembly having a plurality of presettable voltage selector and indicator units or modules for actuation by finger-touch control and which are especially suited for multi-channel receiver application, such as radio and television, employing electronically-tuned, voltage-responsive tuner apparatus.

Conventional all-electronic tuners for television receivers or other multi-channel receiver apparatus usually incorporate an arrangement having one or more voltage-responsive variable reactance devices in the tuning circuits thereof for selectively controlling the frequency or channel to which the set or receiver is attuned. One such voltage responsive device is the form of a voltage variable diode or capacitor, commonly referred to as a varicap or varactor diode. The varactor diode exhibits a capacitive reactance value directly dependent upon the magnitude of an applied DC control voltage. Accordingly such tuners, and in turn the receiver itself, may be selectably controlled by applying the required predetermined voltage to the particular varactor diode serving as the frequency determining element and, with respect to television receivers, effect the desired VHF or UHF channel selection.

Previously a number of methods have been utilized for deriving and selectively applying the required range of DC control voltages to the varactor diode or diodes in the associated tuner mechanisms. The more conventional approach has been to provide a plurality of potentiometer devices, collectively supplied from a common source of operating potential, but individually adjusted to effect a specific output DC control voltage. A switching arrangement or other control network may then be incorporated to control the application of the various DC control voltages to the varactor diode as needed, and as determined by the particularized settings of the included potentiometer devices.

All such prior systems, however, have been deficient in one aspect or another. For the most part, the associated potentiometer devices in the prior systems are adjustable to provide any output DC control potential, from zero to the full value of the reference source. This means that a significant portion of the available channels may be tuned in by any of the potentiometer devices. With such wide range selection it is often difficult to determine just what channel in fact is being selected. Moreover, until now, provision has not been made as an integral part of the selector assembly for indicating the particular channel to which the setting of the potentiometer represents. External means, such as numbered tabs, decals or the like, have been necessary and, for the most part, required manual application.

Still another characteristic of the prior systems has been the lack of any facility for fine tuning, at least with respect to the operating characteristics of the potentiometer devices themselves. They have simply been made uniformly adjustable throughout their range, and thus only one control action presented thereby. Fine tuning has required completely separate and independent provision.

SUMMARY OF THE INVENTION

Accordingly, it is an object of the present invention to provide an improved presettable, voltage selector and channel indicator assembly in modular form for controlling an electronically-tuned, multi-channel receiver apparatus which is not subject to the foregoing deficiencies.

A more particular object of the present invention is to provide an improved presettable selector and indicator module of the foregoing type which is particularly adapted to select and indicate by illuminated numerals a desired channel in a varactor tuned television receiver.

Still another object of the present invention is to provide an improved selector and indicator module of the foregoing type for selecting a desired channel in a varactor tuned television receiver which may be actuated by finger-touch control and wherein a plurality of such module units may be combined to effect any given number of channel selections.

Yet another object of the present invention is to provide a presettable selector and indicator module of the foregoing type wherein an associated adjustable potentiometer assembly includes a movable contactor rotatable through a selected range of resistance values in a given number of discrete steps, so as to provide a coarse tuning adjustment for the associated receiver, with the resistance element itself being rotatable through a further predetermined, but substantially narrower range, so as to effect an appropriate fine tuning adjustment facility.

Another object of the present invention is to provide a presettable selector and indicator module of the foregoing type wherein one or more indicator wheels are included to indicate the channel selected upon actuation of the selector module and wherein rotation of at least one of the indicator wheels effects automatically a coarse tuning adjustment of the associated potentiometer for the channel being indicated.

In accordance with a preferred embodiment of the present invention, a presettable voltage selector and channel indicator arrangement is provided in modular form for deriving and selectively applying the necessary DC control voltage to obtain the desired channel selection in a multi-channel receiver employing electronically-tuned, voltage-responsive tuner apparatus. The modular unit includes an adjustable potentiometer electrically interposed between a source of reference potential and one of the frequency determining elements, e.g., a varactor diode, in the associated television tuner mechanism. The selector module includes at least one rotatable indicator wheel with appropriate reference numerals imprinted on the peripheral surface thereof and which may be conveniently positioned to indicate the channel to be selected upon actuation of the module. It will be appreciated that only one such indicator wheel is required in conjunction with channels in the VHF frequency range while two such wheels are preferred for providing a visual indication regarding the various VHF channels.

Operationally, the associated movable contactor element of the potentiometer assembly is mechanically coupled to a selected one of the indicator wheels so that upon the same being rotated through and to some fixed position corresponding to a given reference numeral on the wheel, the contactor is also rotated to a position on the resistance element of the potentiometer so as to provide a coarse tuning adjustment for the channel so indicated. Provision for fine tuning is in the form of an additional movable element, such as a thumb wheel, which rotates the resistance element itself within a further predetermined, but substantially narrower, range of adjustment. The thumb wheel is designed with a spiral groove on its inner face which cooperates with toothed projections extending outwardly from the resistive element. The spiral groove may be designed to effect whatever tuning ratio may be desired. Access to the thumb wheel for fine tuning, and also to the channel indicator wheel or wheels, is gained by removing a detachable pushbutton-shaped decorative face plate or bezel. Actuation of the selector module is effected by finger touch of spaced contact surfaces extending or protruding through the bezel face. The contacts are intended for interconnection to appropriate logic switching circuitry (not part of the present invention). Illumination of the numerals impressed on the indicator wheels is accomplished by an incandescent bulb insertable within the interior of the wheel or wheels themselves and energized upon actuation of the finger contacts of the module.

It is to be understood that a number of the presettable selector/indicator modules may be combined in a composite assembly to provide for any number of channel selections up to a total of 81 (Channels 2 through 83). From a practical viewpoint, however, a somewhat limited number, say 18, may well be sufficient. This provides for 12 VHF Channels (2 through 13) and a nominal six UHF channel selection.

The selector/indicator module unit as herein set forth and described, however, is in no way limited to television receivers. It may find appropriate use in any application where the need to indicate a potentiometer setting or value by one or more reference symbols would be advantageous, and to effect the selection of that value or setting by a simple finger-touch control or pushbutton action. This would obviously encompass a wide range of electrical and electronic instrumentation and apparatus.

The novel features which are believed characteristic of the present invention are set forth with particularity in the appended claims. The invention itself, however, will best be understood by referring to the following description when taken in conjunction with the drawings, in which:

Figure 1:
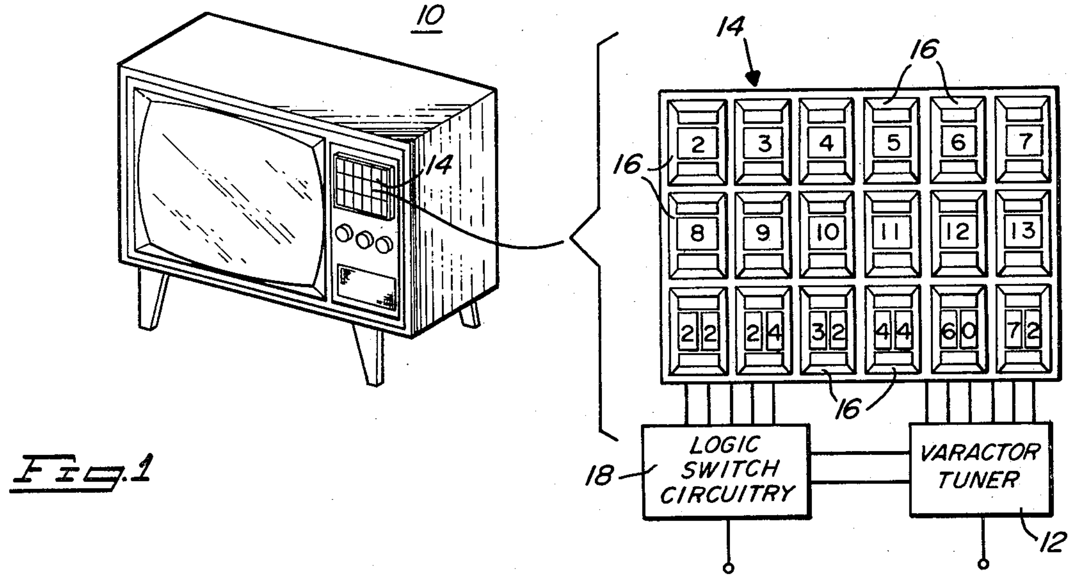
FIG. 1 is a graphic representation of a television receiver incorporating a varactor tuner actuated by a plurality of presettable voltage selector and channel indicator module units in accordance with the present invention.

Referring now to the drawings, a television receiver is illustrated graphically at 10, which receiver incorporates a varactor tuner indicated in block diagram form at 12. The varactor tuner 12 is in turn selectively controlled by a composite pushbutton control assembly 14 comprising a plurality of selector/indicator module units 16. Actuation of the individual module units selectively controls the varactor tuner 12 through a suitable switching arrangement, such as the logic switching control network indicated generally at 18.

Figure 2:
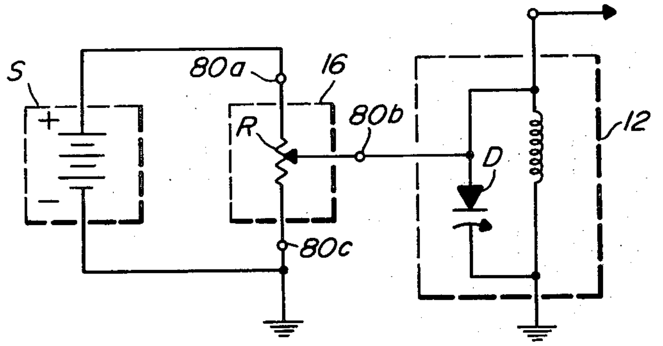
FIG. 2 is a simplified schematic representation of an adjustable potentiometer assembly of the selector unit interconnecting a source of reference potential and a varactor diode serving as one of the frequency determining elements of such a tuner mechanism.

As indicated schematically in FIG. 2, each of the selector/indicator modules 16 includes an adjustable resistance R which upon suitable actuation of module unit 16, is operatively connected by the action of logic switching circuitry 18 to a source of DC control voltage, indicated at reference S. The adjustable arm of the resistance R is also connected by switching network 18 to a frequency determining element of tuner 12, or in the case at hand, a varactor diode as indicated at D.

Figure 3:
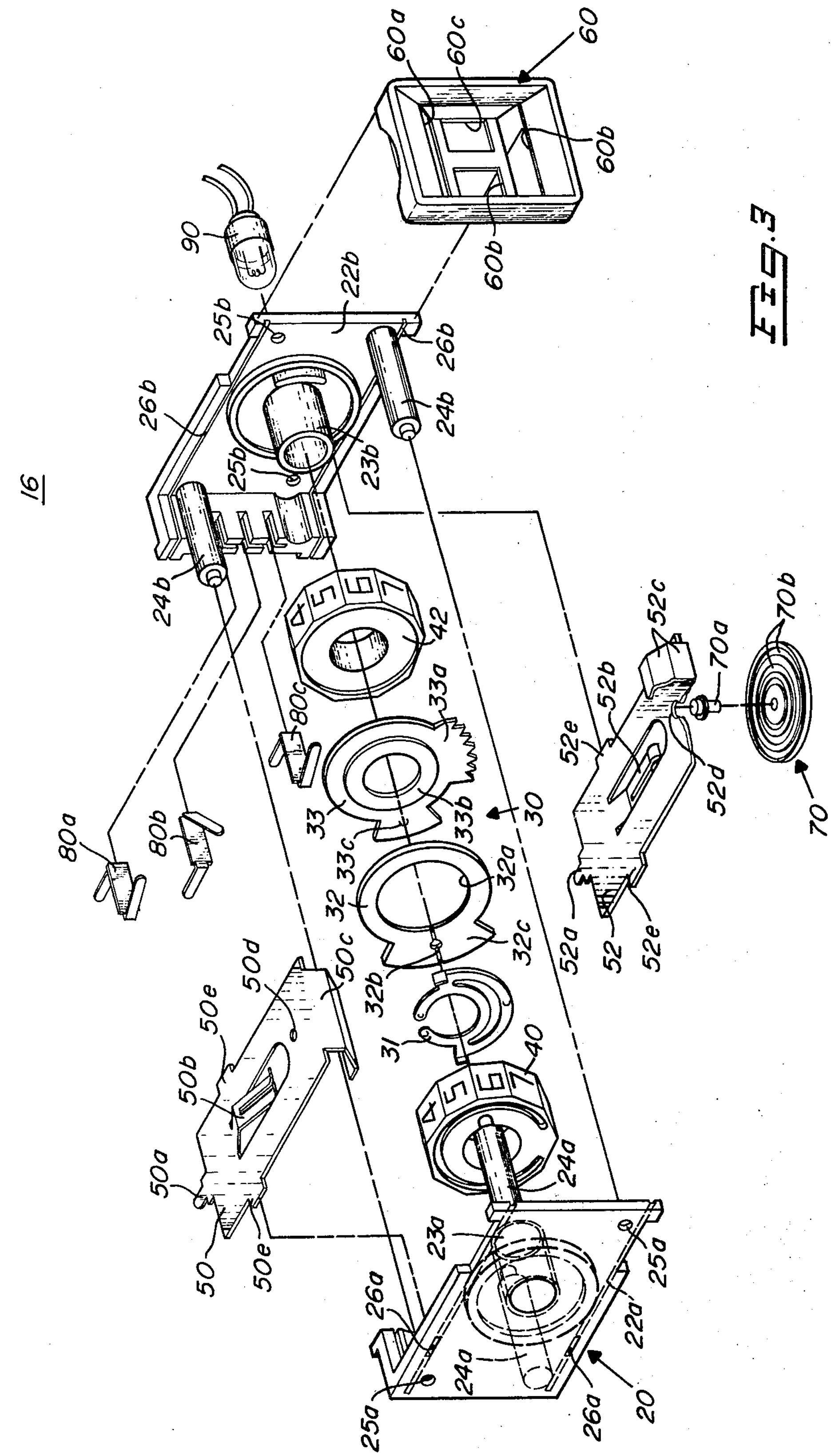
FIG. 3 is an exploded view in perspective of one such selector/indicator module incorporating the present invention.

As best seen in FIG. 3 each of the individual voltage selector and channel indicator module units 16 include, inter alia, an enclosure 20 formed by a pair of complementary housing members 22*a* and 22*b*, a potentiometer assembly 30 consisting of a movable contactor 31, a resistance element 32, and a conductive ring 33, and a pair of indicator wheels 40 and 42. The latter includes the reference numerals 0 to 9 imprinted upon, and spaced radially about, the peripheral surfaces thereof. Indicator wheels 40 and 42, and the associated members 31, 32, and 33 forming potentiometer assembly 30, are mounted in substantially coaxial alignment within housing 20 by way of the cylindrical projections or mounting posts 24*a* and 24*b* extending laterally through formed openings in the indicator wheels 40 and 42 and the associated component parts of potentiometer assembly 30. Housing members 22*a* and 22*b* are positioned and latched in their assembled position by a pair of rod members 24*a* and 24*b*, having a reduced shoulder portion at their forward or free end for friction fit within a formed opening or aperture in the opposing housing member 22*a* or 22*b*. As indicated, connector rods 24*a* on housing member 22*a* cooperates with the complimentary apertures 25*b* in housing member 22*b*, with rods 24*b* on housing member 22*b* cooperating with associated apertures 25*a* in housing member 22*a*.

Figure 4:
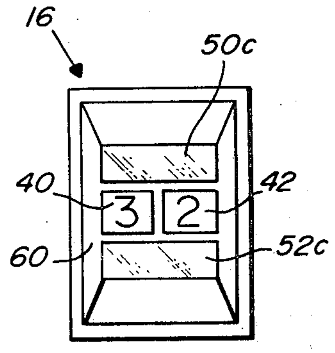
FIG. 4 is an enlarged front elevational view of the selector/indicator module of FIG. 3.

A pair of contactor or switch plates 50 and 52 form the top and bottom of housing 20 with their respective sides being received within formed slots 26*a* and 26*b* running longitudinally along the interior of housing members 22*a* and 22*b*, as shown. Switching plates 50 and 52 include respective tab portions 50*a* and 52*a* extending outwardly beyond the rear wall of housing 20, and which are intended to serve as appropriate terminals for interconnection to switching circuitry 18. Additionally, plates 50 and 52 are formed with leaf springs 50*b* and 52*b* at substantially centralized locations therein, the purpose of which will be described subsequently. Switch plates 50 and 52 also include L-shaped members 50*c* and 52*c* depending from the forward ends thereof and which serve as the actual contact surfaces for actuating the module unit 16. The contact surfaces 50*c* and 52*c* are rendered accessible through rectangular slots 60*a* and 60*b* formed in a detachable face plate or bezel 60 at the front of the housing 20. Bezel 60 includes an additional pair of rectangular openings 60*b* and 60*c* through which selected reference numerals in the peripheral surfaces of the indicator wheels 40 and 42 may be viewed (best seen in FIG. 4).

Finally, to complete the assembly of the selector/indicator module unit 16, a thumb wheel 70 is positioned on the underside of contact plate 52 at its forward end. Thumb wheel 70 has a central pivot 70*a* which effects a friction fit with aperture 52*d* of contact plate 52. Leaf spring 52*b* provides suitable contact pressure on the outer surface of thumb wheel 70 to maintain pivot 70*a* in its engaged position with aperture 52*d*. Thumb wheel 70 further includes a spiral groove or channel 70*b* on its inner face which is intended to cooperate with the ribbed serrations or gear teeth formed in tab extension 33*a* on the conductive ring member 33. Ring member 33 has a raised, circular shoulder portion 33*b* which fits snuggly within the central opening 32*a* formed in resistance element 32. A detent or dimple 33*c* on the ring member 33 cooperates with a complimentary indentation 32*b* to maintain conductor ring 33 and resistance element 32 in a fixed relation to each other. Accordingly, rotation of thumb wheel 70 causes the conductive ring 33 to rotate about its axis and, in turn, a like rotation for resistance element 32. Resistance 32 is thus rotatable through a predetermined arc as defined by the sides or end portions of arcuate portion 32*c* acting as stops in conjunction with the inner surface leaf springs 50*a* and 52*b* of contactor plates 50 and 52.

In operation, it will be seen that a particular voltage selector and channel indicator module 16 in the composite assembly 14 may be selectively actuated by the expedient of a user placing his or her finger within the recessed portion of the bezel face plate 60. The finger contact between contact surfaces 50*c* and 52*c* is effective to initiate appropriate switching action by logic switching circuitry 18 whereby the potentiometer assembly 30 of the selected module 16 is electrically interposed between the source of DC operating potential S and the frequency determining element, i.e. varactor diode D, of tuner mechanism 12. As indicated in FIG. 2, this is effected by electrically switching potentiometer terminals 80*a* and 80*b* at respective ends of resistance element R to respective output terminals at the source of operating potential S. Terminal 80*c* corresponding to the movable contact arm 31 of potentiometer assembly 30 is operatively connected to the appropriate varactor diode D in tuner 12. Accordingly, depending upon the magnitude of the potential source S and the particular setting of the potentiometer assembly 30 in the particular selector/indicator module 16, the tuner 12 will be rendered effective to make a predetermined channel selection. At the same time, switching circuitry 18 also energizes an incandescent light bulb 90 or the like, which is positioned in the interior of mounting posts 23*a* and 23*b* on which indicator wheels 40 and 42 are rotatably mounted. Indicator wheels are constructed of a suitable translucent material but with their peripheral surfaces, excluding the reference numbers, being coated with an opaque material, such as paint or the like. With housing 20 also constructed of a translucent material, it will be understood that the reference numerals on the indicator wheels 40 and 42, which are aligned with openings 60*c* and 60*b* of bezel 60, will be illuminated upon energizing of light 90 to provide a convenient visual indication of the particular channel to which the television receiver 10 is attuned.

In the initial setup for the respective selector/indicator module unit 16, the face plate or bezel 60 of the particular unit is removed to obtain access to the associated indicator wheels 40 and 42 and the thumb wheel 70. For VHF channel selection, there would be only one such indicator wheel required, say for example, wheel 40, while both wheels, 40 and 42, are required for appropriate UHF channel selection and indication. As an example, it may be assumed that a UHF channel selection of Channel 32 is desired for the particular selector/indicator module unit 16 under consideration. Accordingly, the indicator wheel 40 is rotatably positioned so that the reference numeral 3 is aligned with the opening 60*b* in the bezel face plate 60. Wheel 42 is likewise rotated to a selected position wherein the reference numeral 2 is aligned with opening 60*c* in bezel 60. At the same time, rotation of indicator wheel 40 also determines the position or setting of contactor 31 by virtue of the mechanical coupling therebetween. Contactor 31 makes a suitable connection between the resistive resistance element 32 and the conductive ring 33 in electrical contact with terminal 80*b*. This, it will be readily understood, provides a coarse adjustment for the particular channel selection desired, or in the case at hand, a selected range encompassing a nominal channel selection, say for example, Channel 35 plus or minus some 10 channels depending on the setting of the fine tuning control. The fine tuning facility is then utilized to effect the precise tuning adjustment required to bring in Channel 32 on the receiver apparatus. Fine tuning, as previously described, is obtained by rotating thumb wheel 70 which in turn adjusts resistance element 32 through a further but somewhat limited range of rotary movement while the contactor element 33 remains in its stationary set position.

Once the appropriate fine tuning has been accomplished, the bezel face plate 60 may then be replaced and the particular selector/indicator module unit 16 will thereafter, when actuated, provide for Channel 32 selection. In like manner, each of the other selector/indicator module units may be preset to provide a particular channel selection throughout the VHF and UHF television frequency ranges. It is to be understood that the particular channel selection as effected by each of the selector/indicator units may be quickly and conveniently changed whenever desired in the manner as above described.

While only one particular embodiment of the present invention has been set forth and described herein, it will be realized that various modifications and alternative constructions may be made without departing from the true scope and spirit of the invention itself. Accordingly, the appended claims are intended to cover all such modifications and alternative constructions that fall therein.

Having thus described the invention, what is claimed is:

1. In a multi-channel receiver, a voltage selector and channel indicator arrangement for deriving a tuning voltage to be applied to voltage responsive tuner apparatus, comprising in combination:

adjustable resistance means having a resistance element for interconnection to a source of reference potential and a movable contact element serving as the output terminal at which a control voltage is developed, the magnitude of which is dependent upon the setting of said contactor relative to said resistance element;

adjustable rotary dial means coupled to said movable contactor whereby the setting of said dial means to provide a visual digital readout for a particular channel further determines the setting of said contactor relative to said resistance element so as to provide a coarse tuning adjustment for the channel so indicated;

means coupled to said resistance element for adjusting the same through a predetermined but limited range of movement while said contactor remains in a stationary preset position so as to provide a fine tuning adjustment for said indicated channel; and electronic switch means for activating said selector and indicator unit by finger touch control.

2. A voltage selector and channel indicator arrangement in accordance with claim 1 wherein the multi-channel receiver comprises television apparatus and wherein said indicator means includes at least one rotable indicator wheel having a series of reference numerals imprinted in consecutive fashion about the peripheral surfaces thereof and which may be positioned to indicate a selected television channel.

3. A voltage selector and channel indicator arrangement in accordance with claim 2 wherein said indicator wheels are constructed of a translucent material and wherein an incandescent light may be positioned within the interior thereof to illuminate said reference numerals.

4. The voltage selector and channel indicator arrangement in accordance with claim 1 wherein said fine tuning means comprises a thumb wheel having a spiral groove on its inner face positioned to effect rotable engagement with a projection on said adjustable resistance means extending normal to its axis of rotation.

5. A voltage selector and channel indicator arrangement in accordance with claim 1 wherein said switch actuator means comprises a pair of spaced contact members for interconnection to an associated switching network, said contact members having respective contact surfaces extending therefrom for bridging by finger touch to actuate said switching action.

6. A voltage selector and channel indicator arrangement in accordance with claim 1 which includes a subminiaturized modular housing having a removable front face plate for providing access to said adjustable indicator means and said fine tuning means.

7. A selector/indicator arrangement for deriving a plurality of tuning voltages for selective application to voltage responsive tuner apparatus in a multi-channel receiver, comprising:

a control assembly formed of a plurality of voltage selector and channel indicator units in modular form, each of which includes;

adjustable resistance means having a resistance element for interconnection to a source of reference potential and a movable contactor element serving as the output terminal at which a control voltage is developed, the magnitude of which is dependent upon the setting of said contactor relative to said resistance element, adjustable rotary dial means coupled to said movable contactor whereby the setting of said dial means to provide a visual digital readout for a particular channel further determines the setting of said contactor relative to said resistance element so as to provide a coarse tuning adjustment for the channel indicated, means coupled to said resistance element for adjusting the same through a predetermined but limited range of movement while said contactor remains in a stationary preset position so as to provide a fine tuning adjustment for said indicated channel, and electronic switch means for activating the associated selector/indicator unit by finger touch control.

* * * * *